US012738634B2

(12) United States Patent
Vincent et al.

(10) Patent No.: US 12,738,634 B2
(45) Date of Patent: Sep. 15, 2026

(54) PACKAGE ON PACKAGE SEMICONDUCTOR DEVICE WITH INTEGRATED ANTENNA AND METHOD THEREFOR

(71) Applicant: NXP USA, INC., Austin, TX (US)

(72) Inventors: Michael B. Vincent, Chandler, AZ (US); Nikita Mahjabeen, Austin, TX (US)

(73) Assignee: NXP USA, INC., Austin, TX (US)

( * ) Notice: Subject to any disclaimer, the term of this patent is extended or adjusted under 35 U.S.C. 154(b) by 345 days.

(21) Appl. No.: 18/656,659

(22) Filed: May 7, 2024

(65) Prior Publication Data

US 2025/0350018 A1 Nov. 13, 2025

(51) Int. Cl.

*H01Q 1/22* (2006.01)
*H10W 44/20* (2026.01)

(Continued)

(52) U.S. Cl.

CPC .......... *H01Q 1/2283* (2013.01); *H10W 44/20* (2026.01); *H10W 70/685* (2026.01); *H10W 74/01* (2026.01); *H10W 74/117* (2026.01); *H10W 90/00* (2026.01); *H10W 44/216* (2026.01); *H10W 90/724* (2026.01)

(58) Field of Classification Search

USPC .......................................................... 343/834

See application file for complete search history.

(56) References Cited

U.S. PATENT DOCUMENTS 5,521,406 A * 5/1996 Tserng ................ H10W 20/483 257/276
6,940,361 B1 9/2005 Jokio et al.

(Continued)

FOREIGN PATENT DOCUMENTS

CN 114080096 A * 2/2022 ............ H10W 90/00
DE 102006007381 A1 * 8/2007 ......... H01Q 21/0025

(Continued)

OTHER PUBLICATIONS

U.S. Appl. No. 18/501,108 Non-Final Office Action issued on May 15, 2026; 7 Pages.

(Continued)

*Primary Examiner* — Dimary S Lopez Cruz
*Assistant Examiner* — Brandon Sean Woods

(57) ABSTRACT

A method of forming a package-on-package semiconductor device is provided. The method includes mounting an antenna sub-assembly on a first major side of a package substrate and a packaged RF semiconductor device on a second major side of the package substrate. The antenna sub-assembly includes an antenna substrate, an antenna substrate waveguide, and an antenna structure. The antenna substrate waveguide is aligned with a waveguide formed through the package substrate. The packaged RF semiconductor device includes a semiconductor die, an RDL formed over an active side of the first semiconductor die, and a signal launcher formed from a conductive layer of the RDL. The signal launcher is configured for propagation of an RF signal through the waveguide formed through the package substrate and the antenna substrate waveguide.

20 Claims, 8 Drawing Sheets

(51) Int. Cl.

| | |
|---|---|
| ***H10W 70/685*** | (2026.01) |
| ***H10W 74/01*** | (2026.01) |
| ***H10W 74/10*** | (2026.01) |
| ***H10W 90/00*** | (2026.01) |

(56) References Cited

U.S. PATENT DOCUMENTS

| | | | | |
|---|---|---|---|---|
| 7,167,688 | B2 * | 1/2007 | Li | H04B 1/38 455/107 |
| 8,169,060 | B2 | 5/2012 | Maurer et al. | |
| 8,256,685 | B2 * | 9/2012 | Chen | G06K 19/07749 235/492 |
| 9,257,735 | B2 | 2/2016 | Fakharzadeh et al. | |
| 10,615,134 | B2 | 4/2020 | Spella et al. | |
| 11,031,681 | B2 * | 6/2021 | Vincent | H01P 3/121 |
| 11,081,776 | B2 * | 8/2021 | Lu | H01Q 1/22 |
| 11,557,544 | B2 * | 1/2023 | Vincent | H01Q 1/2283 |
| 11,862,584 | B2 * | 1/2024 | Tang | H01P 11/002 |
| 2019/0348746 | A1 | 11/2019 | Gupta et al. | |
| 2021/0225719 | A1 * | 7/2021 | Seler | H01Q 1/2283 |
| 2022/0189894 | A1 | 6/2022 | Zanati et al. | |
| 2022/0209779 | A1 | 6/2022 | Herbsommer et al. | |
| 2023/0017646 | A1 * | 1/2023 | Vincent | H01Q 1/2283 |
| 2023/0044903 | A1 * | 2/2023 | Vincent | H01Q 1/2283 |
| 2024/0038691 | A1 | 2/2024 | Khanolkar et al. | |
| 2024/0222296 | A1 | 7/2024 | Zanati et al. | |
| 2024/0224423 | A1 | 7/2024 | Zanati et al. | |

FOREIGN PATENT DOCUMENTS

| | | | | |
|---|---|---|---|---|
| DE | 102019128779 | B4 * | 5/2021 | H10W 44/20 |
| EP | 4016620 | A1 | 6/2022 | |
| EP | 4648107 | A1 * | 11/2025 | H10W 90/00 |
| WO | 2021142401 | A1 | 7/2021 | |
| WO | 2023104255 | A1 | 6/2023 | |

OTHER PUBLICATIONS

Francesco Filice et al.: "Antenna Array Design in multilayer PCB allowing chip embedding and Air Filled Substrate Integrated Waveguides for D Band Radar Applications" IMEC , WM9 EuMIC workshops; Sep. 18, 2023; 25 pages.

Huang, G., "A low cost 60GHz antenna in Fan-Out Panel Level Package for millimeter-wave radar application", 2020 21st International Conference on Electronic Packaging Technology (ICEPT), Aug. 12-15, 2020.

U.S. Appl. No. 18/501,108, filed Nov. 3, 2023, entitled "Package On Package Semiconductor Device With Integrated Waveguide and Method Therefor".

Anim, K., "High-Gain Millimeter-Wave Patch Array Antenna for Unmanned Aerial Vehicle Application", MDPI, Sensors , Jun. 6, 2021.

Li, Y., "Low-Cost High-Gain and Broadband Substrate-Integrated-Waveguide-Fed Patch Antenna Array for 60-GHz Band", IEEE Transactions on Antennas and Propagation, vol. 62, No. 11, Nov. 2014.

Molina Moreno, R., "77 GHz waveguide antenna and transition for FMCW MIMO on-chip radar for autonomous driving applications", Thesis, TU/e Eindhoven University of Technology, Jun. 17, 2022.

* cited by examiner 408
406
404
424
422
410
402
400
412
420
414
418
416
424

PACKAGE ON PACKAGE SEMICONDUCTOR DEVICE WITH INTEGRATED ANTENNA AND METHOD THEREFOR

BACKGROUND

Field

This disclosure relates generally to semiconductor device packaging, and more specifically, to package-on-package semiconductor devices with integrated antenna and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. For some higher performance features and applications, the configuration of the semiconductor device packages may be susceptible to performance constraints and higher product or system costs. Accordingly, significant challenges exist in accommodating these higher performance features and applications while enabling semiconductor devices' enhanced performance without significant costs impact.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a package-on-package semiconductor device including an integrated antenna. The package-on-package semiconductor device includes an antenna sub-assembly and a semiconductor die mounted on a top side of a package substrate. The antenna sub-assembly includes a non-conductive antenna substrate, an antenna substrate waveguide, and an antenna structure. The waveguide of the antenna sub-assembly is aligned with a waveguide formed through the package substrate. A packaged RF semiconductor device is mounted on a bottom side of the package substrate. The packaged RF semiconductor device includes a redistribution layer having a conductive layer configured to form a signal launcher. The signal launcher is interconnected with a semiconductor die of the RF semiconductor device by way of the redistribution layer. The signal launcher of the packaged RF semiconductor device is aligned with the waveguides of the package substrate and antenna sub-assembly. Accordingly, a low loss RF signal path from the RF semiconductor die through the waveguide of the package substrate and through the waveguide and antenna of antenna sub-assembly is formed. By forming the package-on-package semiconductor device with an embedded antenna sub-assembly in this manner, the RF signal radiation pattern is not obstructed by components of the semiconductor device.

Figure 1B:
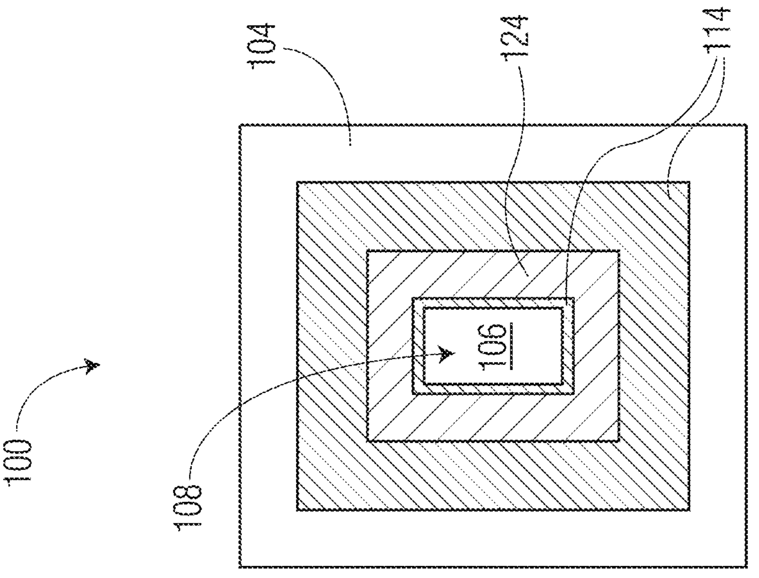
FIG. 1A and FIG. 1B illustrate, in simplified cross-sectional and plan views, an example antenna sub-assembly at a stage of manufacture in accordance with an embodiment.
Figure 1A:
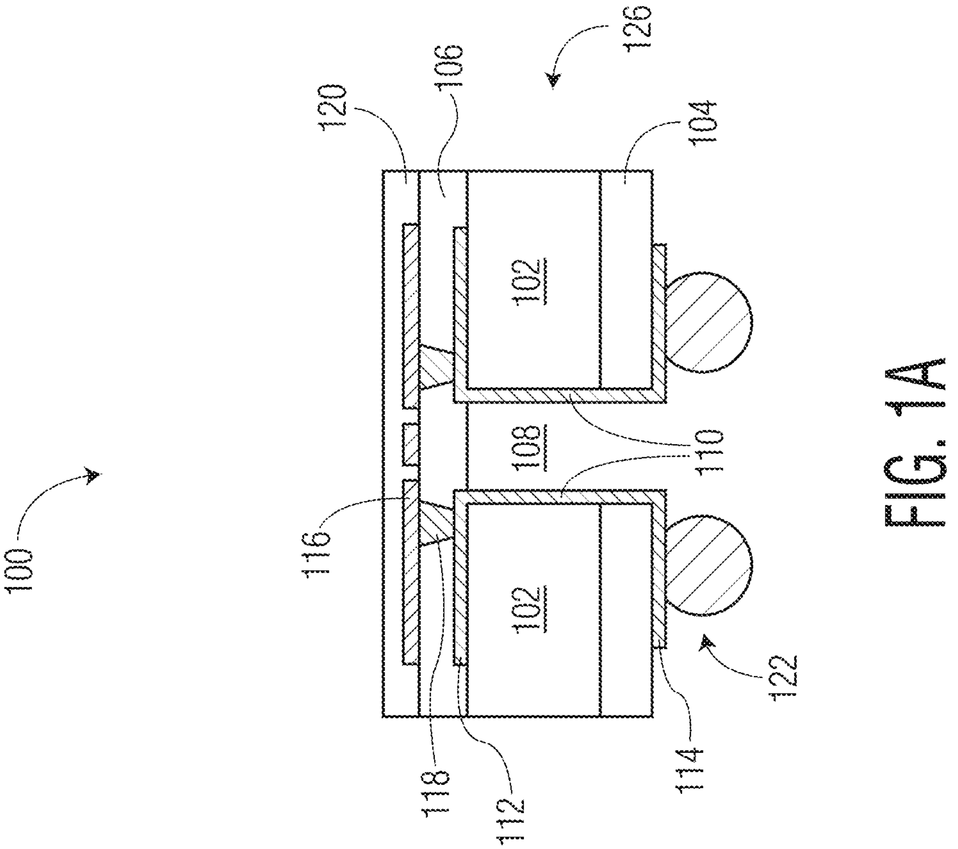

FIG. 1A and FIG. 1B illustrate, in simplified cross-sectional and plan views, an example antenna sub-assembly 100 at a stage of manufacture in accordance with an embodiment. For example, FIG. 1A depicts a cross-sectional view of the example antenna sub-assembly 100 and FIG. 1B depicts a bottom-side-up plan view corresponding with FIG. 1A. In this embodiment, the antenna sub-assembly 100 includes a non-conductive laminate antenna substrate 126, an antenna substrate waveguide 108, and an antenna structure 116. The antenna substrate 126 includes a core (e.g., FR4) portion 102, a first dielectric layer 104 formed on a bottom side of the core portion, and a second dielectric layer 106 formed on a top side of the core portion. The dielectric layers 104 and 106 may be formed from a suitable non-conductive material such as prepeg, epoxy, polyimide, and the like, for example. The term "conductive," as used herein, generally refers to electrical conductivity unless otherwise described.

In this embodiment, the antenna substrate waveguide 108 is formed as an air-filled opening through the core portion 102 and through the first dielectric layer 104 of the antenna substrate 126. A conductive waveguide lining (e.g., copper layer) 110 is formed on sidewalls of the antenna substrate waveguide 108. A first conductive layer 112 is formed on the top side of the core portion 102 and a second conductive layer 114 is formed on the bottom side of the first dielectric layer 104 of the antenna substrate 126. In this embodiment, the first conductive layer 112 is in a plane substantially parallel with the plane of the second conductive layer 114. Each of the conductive layers 110, 112 and 114 is configured to surround the antenna substrate waveguide 108. The first conductive layer 112 and the second conductive layer 114 are directly connected to one another by way of the conductive waveguide lining 110, for example. Accordingly, a continuous conductive path is formed from the first conductive layer 112 to the second conductive layer 114.

The antenna structure 116 is formed at the top side of the antenna substrate 126 and interconnected with the conductive layer 112 by way of conductive vias 118 in this embodiment. A non-conductive protective layer 120 (e.g., solder mask) may be formed over the antenna structure 116. It may be desirable to have an opening in the protective layer 120 such that the antenna structure 116 may be exposed (e.g., not covered by the protective layer). In this embodiment, the antenna structure 116 is depicted as a slot antenna and configured for transmission of radio frequency (RF) signals having frequencies in a range of 100 GHz and higher, for example. In other embodiments, the antenna structure 116 may be formed in other antenna configurations.

In this embodiment, the conductive layer 114 is exposed at the bottom side of the antenna sub-assembly 100 and configured for attachment to a package substrate (e.g., at a subsequent stage of manufacture) by way of a plurality of conductive sub-assembly connectors 122. The sub-assembly connectors 122 may be in the form of solder balls, solder paste, conductive glue, nano wires, and the like, for example. The sub-assembly connectors 122 are configured to form a continuous conductive ring 124 as depicted in FIG. 1B when affixed to the package substrate. In this embodiment, the antenna structure may be interconnected to a ground voltage supply (not shown) by way of the package substrate.

Figure 2:
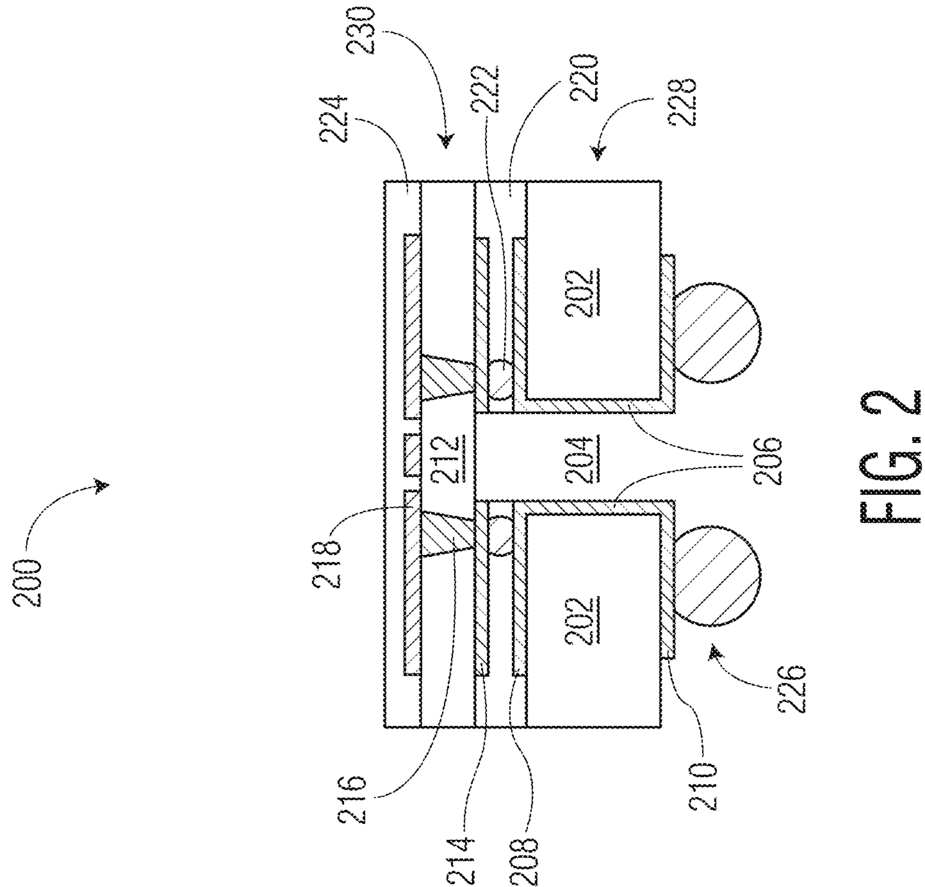
FIG. 2 illustrates, in a simplified cross-sectional view, an alternative example antenna sub-assembly at a stage of manufacture in accordance with an embodiment.

FIG. 2 illustrates, in a simplified cross-sectional view, an example alternative antenna sub-assembly 200 at a stage of manufacture in accordance with an embodiment. In this embodiment, the antenna sub-assembly 200 includes a base antenna substrate 228 and a pre-formed antenna structure 230. The base antenna substrate 228 includes a core (e.g., FR4) 202 and an antenna substrate waveguide 204 formed as an air-filled opening through the core 202. A conductive waveguide lining (e.g., copper layer) 206 is formed on sidewalls of the waveguide 204, a top conductive layer 208 is formed on the top side of the core 202, and a bottom conductive layer 210 is formed on the bottom side of the core 202. Each of the conductive layers 208 and 210 is configured to surround the antenna substrate waveguide 204. The top conductive layer 208 and the bottom conductive layer 210 are directly connected to one another by way of the waveguide lining 206, for example. Accordingly, a continuous conductive path is formed from the top conductive layer 208 to the bottom conductive layer 210.

In this embodiment, the pre-formed antenna structure 230 includes a core (e.g., FR4) 212, a conductive layer 214 formed at the bottom side, and an antenna structure 218 formed at the top side. The antenna structure 218 is interconnected with the conductive layer 214 by way of conductive vias 216. The conductive layer 214 with an opening that is aligned with the waveguide 204, for example, when the base antenna substrate 228 and the pre-formed antenna structure 230 are joined together. A non-conductive protective layer 224 (e.g., solder mask) may be formed over the antenna structure 218. In this embodiment, the antenna structure 218 is depicted as a slot antenna. In other embodiments, the antenna structure 218 may be formed in other antenna configurations.

The pre-formed antenna structure 230 is affixed to the base antenna substrate 228 by way of a plurality of conductive joining connectors 222 to form the antenna sub-assembly 200 in this embodiment. The joining connectors 222 may be in the form of solder balls, solder paste, conductive glue, nano wires, and the like, for example, and are configured to form a continuous conductive ring surrounding the waveguide 202. A dielectric layer 220 (e.g., prepeg, epoxy, polyimide, the like) may be disposed between the pre-formed antenna structure 230 and the base antenna substrate 228.

In this embodiment, the conductive layer 210 is exposed at the bottom side of the antenna sub-assembly 200 and configured for attachment to a package substrate (e.g., at a subsequent stage of manufacture) by way of a plurality of conductive sub-assembly connectors 226. The sub-assembly connectors 226 may be in the form of solder balls, solder paste, conductive glue, nano wires, and the like, for example. The sub-assembly connectors 226 are configured to form a continuous conductive ring around the waveguide 204 when affixed to the package substrate.

Figure 3:
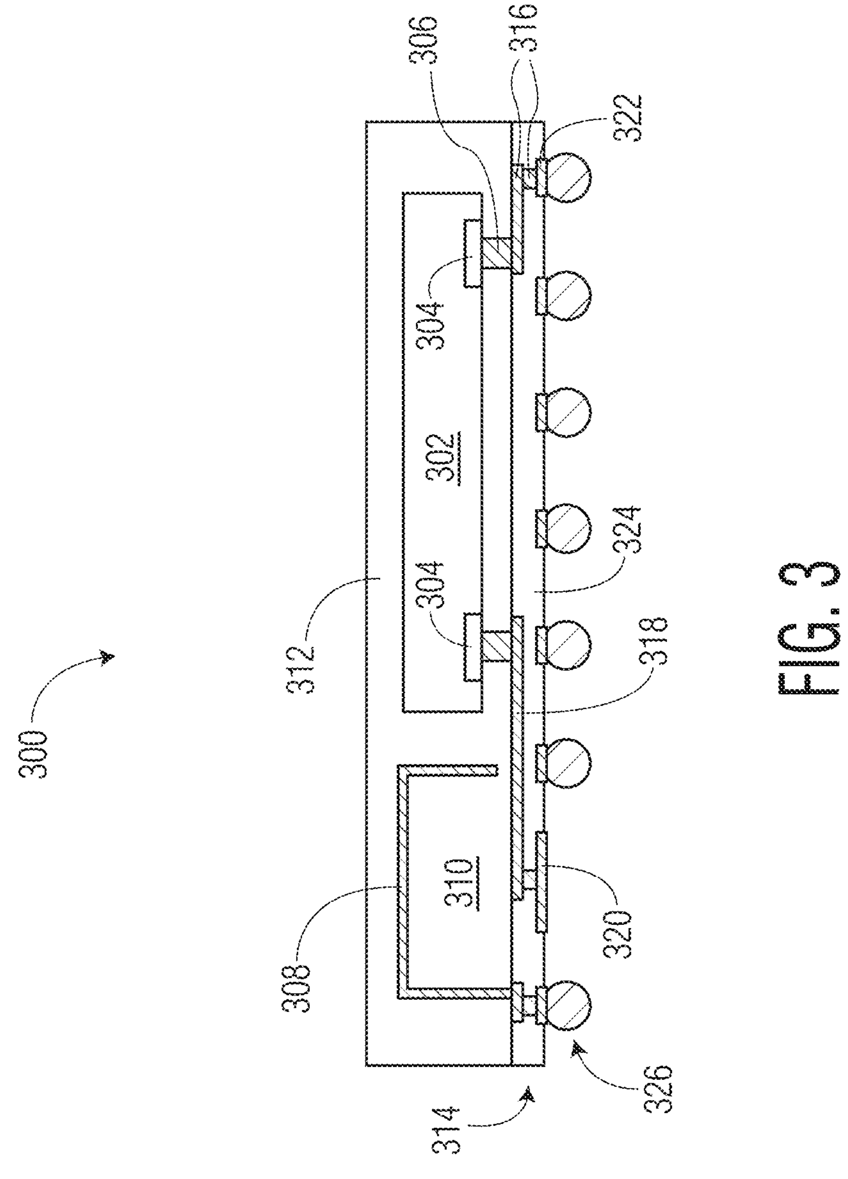
FIG. 3 illustrates, in a simplified cross-sectional view, an example packaged radio frequency (RF) semiconductor device at a stage of manufacture in accordance with an embodiment.

FIG. 3 illustrates, in a simplified cross-sectional view, an example packaged RF semiconductor device 300 at a stage of manufacture in accordance with an embodiment. At this stage of manufacture, the RF semiconductor device 300 includes a semiconductor die 302, an encapsulant 312 (e.g., epoxy molding compound) encapsulating the semiconductor die, and a redistribution layer (RDL) 314 formed over an active side of the semiconductor die and a portion of the encapsulant. In this embodiment, the RDL 314 includes a signal launcher 320 formed from a conductive layer of the RDL. A corresponding conductive signal reflector 308 is aligned with the signal launcher 320 and integrated adjacent to the semiconductor die 302. In this embodiment, the signal reflector 308 is formed as a metal base portion and metal sidewall portions configured to substantially form a metal lined cavity 310. The base portion of the signal reflector 308 is located on an opposing side of the cavity 310 from the signal launcher 320 and in a plane substantially parallel with a plane of the signal launcher 320. In this embodiment, the cavity 310 is shown filled with the encapsulant 312. In some embodiments, the cavity may be air filled or filled with a low Df/Dk dielectric material. In some embodiments, the packaged RF semiconductor device 300 may be characterized as a launcher-in-package device formed as a wafer-level package, for example.

The semiconductor die 302 has the active side (e.g., major side having circuitry) and a backside (e.g., major side opposite of the active side). The semiconductor die 302 includes bond pads 304 formed at the active side and configured for connection to conductive features of the RDL 314 by way of conductive die connectors 306, for example. In this embodiment, semiconductor die 302 is configured in an active-side-down orientation with a die pad 304 at the active side interconnected to the signal launcher 320 by way of the RDL 314 without any solder connections. The semiconductor die 302 may be formed from any suitable semiconductor material, such as silicon, germanium, gallium arsenide, gallium nitride, and the like. In this embodiment, the semiconductor die 302 is characterized as an RF semiconductor die configured to transmit and/or receive RF signals by way of the signal launcher 320 formed in the RDL 314.

The interconnecting RDL 314 is applied over the active side of the encapsulated semiconductor die 302 and cavity 310 of the signal reflector 308. The RDL 314 includes conductive features such as metal traces and vias 316, signal launcher 320 and interconnecting trace 318, and connector pads 322 surrounded by non-conductive material 324. The RDL 314 may be formed as a multi-layer build-up RDL or may be provided as a pre-formed laminate RDL, for example. In this embodiment, the die pad 304 is interconnected to the signal launcher 320 by way of the metal trace 318 of the RDL 314 to form a substantially direct low-loss RF signal path from the semiconductor die 302 to the signal launcher 320. Other signal traces and ground plane and/or ground shield traces of the RDL are not shown for illustration purposes. After the RDL 314 is applied, low-profile conductive connectors 326 are affixed to RDL connector pads 322. The low-profile conductive connectors 326 are configured and arranged to provide conductive connections between the packaged RF semiconductor device 300 and a package substrate at a subsequent stage, for example. In this embodiment, the metal signal reflector 308 may be conductively connected to a ground voltage supply by way of the RDL 314 and respective low-profile conductive connector 326. The conductive connectors 326 may be in the form of suitable conductive structures such as solder balls, gold studs, copper pillars, and the like.

Figure 4:
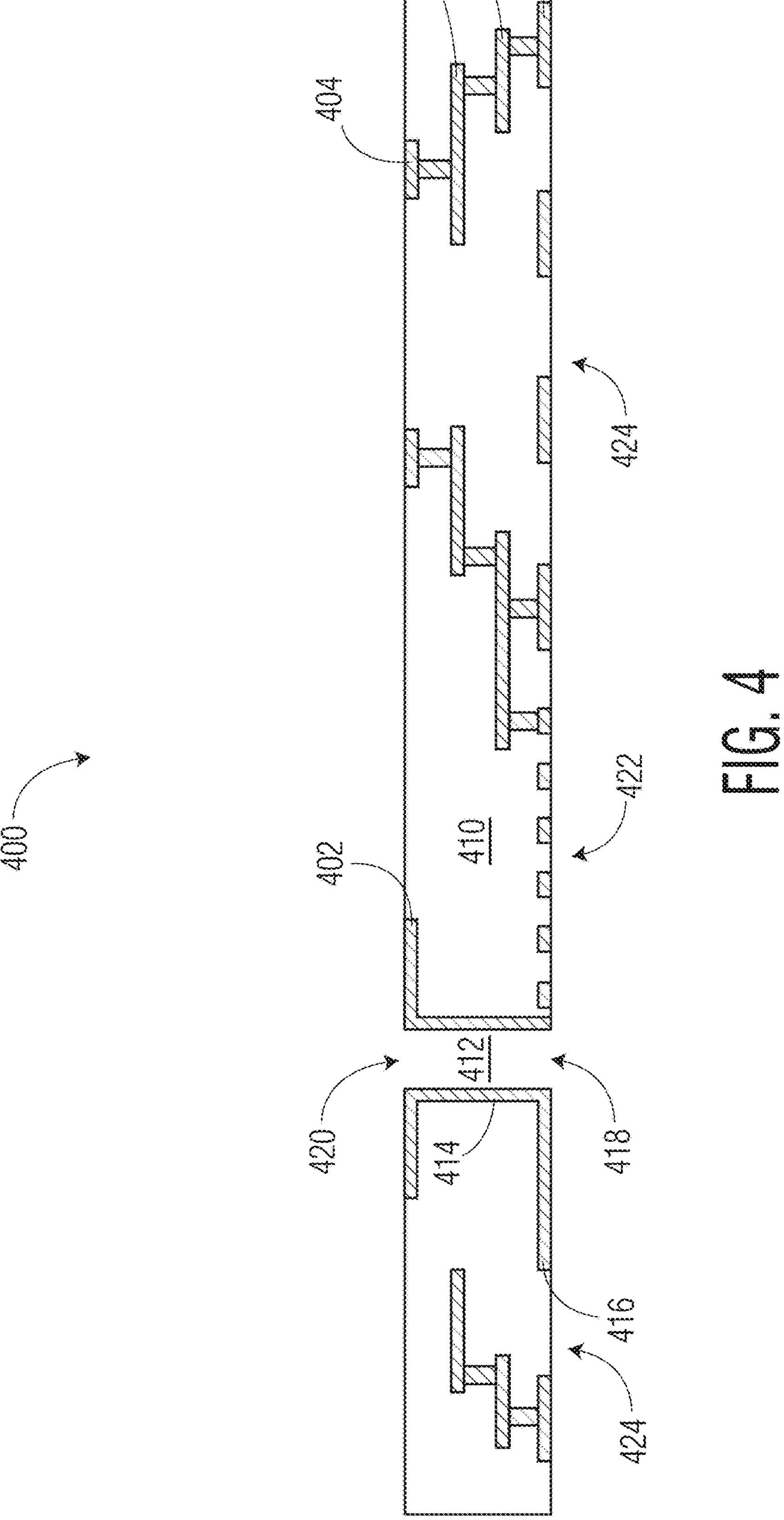
FIG. 4 illustrates, in a simplified cross-sectional view, an example package substrate at a stage of manufacture in accordance with an embodiment.

FIG. 4 illustrates, in a simplified cross-sectional view, an example package substrate 400 at a stage of manufacture in accordance with an embodiment. In this embodiment, the package substrate 400 has a top major side and a bottom major side and includes conductive features such as a plurality of top side conductive pads 402 and 404, a plurality of bottom side conductive pads 406 and 416, conductive traces 408, and a waveguide 412 surrounded by a non-conductive material 410 (e.g., dielectric). The top side conductive pads 402 and 404 are exposed at the top major surface of the package substrate 400. The conductive pads 402 are configured for connection of the antenna sub-assembly 100 (depicted in FIG. 1A), and the conductive pads 404 are configured for connections to the packaged RF semiconductor device 300 (depicted in FIG. 3) at subsequent stages of manufacture, for example.

The bottom side conductive pads 406 and 416 are exposed at the bottom major surface of the package substrate 400. A first portion 422 of the bottom side conductive pads 406 are configured for conductive connections to the packaged RF semiconductor device 300 by way of the conductive connectors 326 of FIG. 3 at a subsequent stage of manufacture. For example, the first portion 422 of the bottom side conductive pads 406 are formed in predetermined locations such that when the packaged RF semiconductor device 300 is mounted to the package substrate 400, the signal launcher (320 of FIG. 3) is properly aligned with the waveguide 412. A second portion 424 of the bottom side conductive pads 406 (including conductive pad 416) are configured for connections to a printed circuit board (PCB) by way of conductive connectors (e.g., solder balls) at a subsequent stage, for example. In this embodiment, the package substrate 400 is formed from a low cost, commercially available substrate-like PCB (SLP) substrate material.

In this embodiment, the waveguide 412 is formed through the package substrate 400. The waveguide 412 includes a top opening 420 at the top major side and a bottom opening 418 at the bottom major side. A conductive lining 414 is formed on the sidewall surfaces of the waveguide 412. For example, the conductive lining 414 may be formed as a metal layer or coating on the sidewall surfaces by way of plating operation. The conductive lining 414 of the waveguide 412 extends from the top opening 420 at the top major side of the package substrate 400 to the bottom opening 418 at the bottom major side of the package substrate. In this embodiment, top side conductive pads 402 and bottom side conductive pad 416 are interconnected by way of the conductive lining 414. The top side conductive pads 402 and conductive lining 414 may be conductively connected to a ground voltage supply by way of the conductive pad 416 of the package substrate 400, for example. The waveguide 412, as depicted in FIG. 4, is configured as an RF signal pathway straight through (e.g., no bends or jogs) the package substrate 400. By forming the waveguide 412 in this manner, the RF signal pathway is the shortest possible distance through the package substrate 400. Even though the waveguide 412 is depicted in a “straight through” configuration, embodiments with other waveguide configurations such as waveguides including bends or jogs are anticipated by this disclosure.

FIG. 5 through FIG. 8 illustrate, in simplified cross-sectional views, an example package-on-package semiconductor device 500 with embedded antenna sub-assembly 100 and attached RF semiconductor device 300 at various stages of manufacture in accordance with an embodiment.

Figure 5:
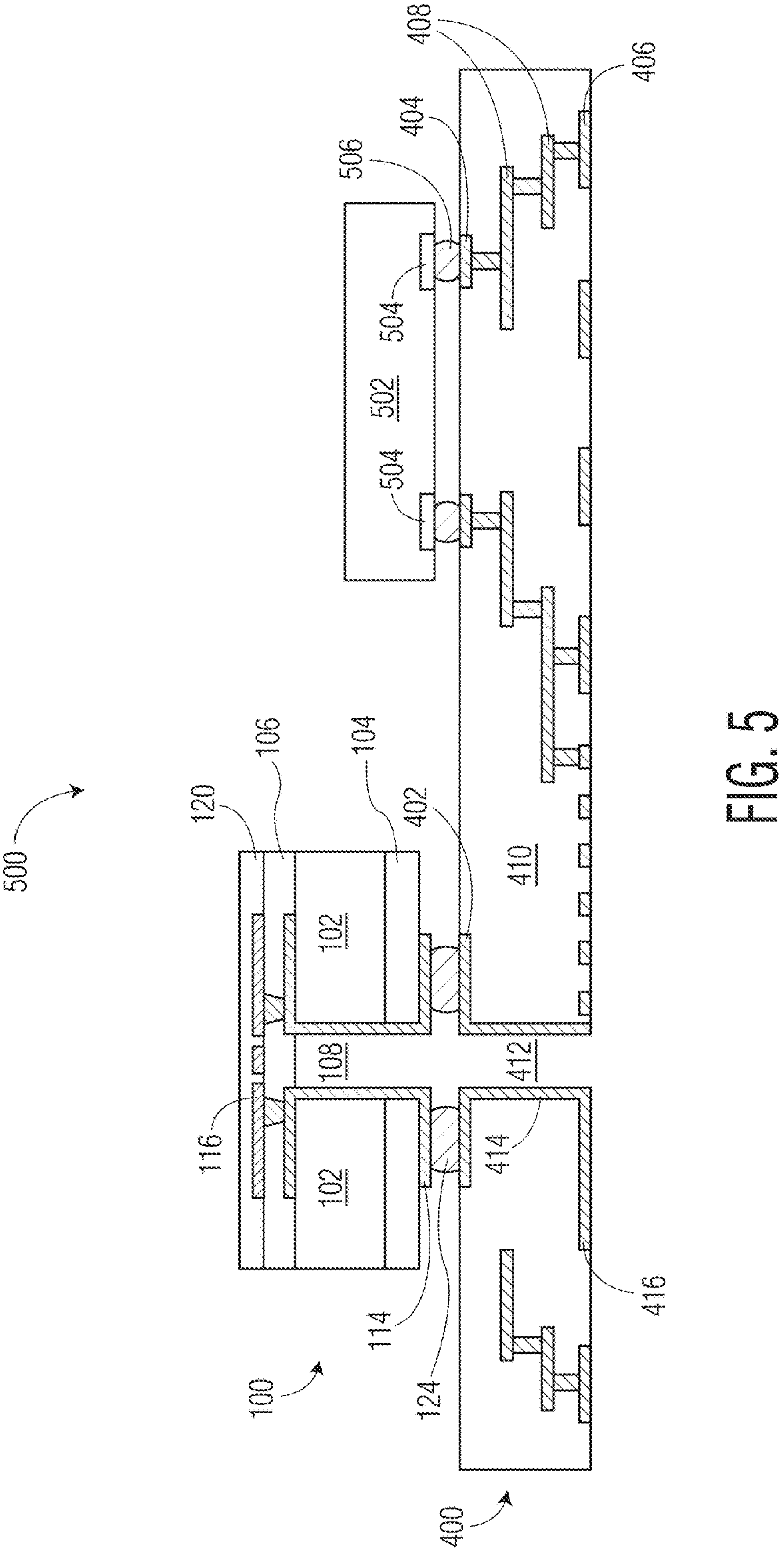
FIG. 5 through FIG. 8 illustrate, in simplified cross-sectional views, an example package-on-package semiconductor device with integrated antenna at various stages of manufacture in accordance with an embodiment.

FIG. 5 illustrates, in a simplified cross-sectional view, an example package-on-package semiconductor device 500 at a stage of manufacture in accordance with an embodiment. At this stage, the package-on-package semiconductor device 500 includes the antenna sub-assembly 100 and a semiconductor die 502 mounted on the package substrate 400. The exposed conductive layer 114 at the bottom side of the antenna sub-assembly 100 is aligned and affixed to the top side conductive pads 402 of the package substrate 400 by way of the continuous conductive ring 124 (e.g., formed by sub-assembly connectors 122 during mounting process). By mounting the antenna sub-assembly 100 to the package substrate 400 in this manner, a continuous waveguide including the waveguide 412 and the waveguide 108 is formed.

The semiconductor die 502 has an active side (e.g., major side having circuitry) and a backside (e.g., major side opposite of the active side). The semiconductor die 502 includes bond pads 504 formed at the active side and configured for connection to conductive features of the package substrate 400 by way of conductive die connectors 506, for example. In this embodiment, semiconductor die 502 is configured in an active-side-down orientation with a die pad 504 at the active side connected to respective top side conductive pads 404. The semiconductor die 502 may be formed from any suitable semiconductor material, such as silicon, germanium, gallium arsenide, gallium nitride, and the like. In this embodiment, the semiconductor die 502 is characterized as a processor semiconductor die configured to process information generated by an RF semiconductor device (e.g., mounted at a subsequent stage), for example.

Bond pads 504 at the active side of the semiconductor die 302 are conductively connected to the top side conductive pads 404 at the top major surface of the package substrate 400 by way of conductive die connectors 506. The conductive die connectors 506 are configured and arranged to provide conductive connections between the semiconductor die 502 and conductive features of the package substrate 400, for example. The conductive die connectors 506 may be in the form of suitable conductive structures such as solder balls, gold studs, copper pillars, and the like.

Figure 6:
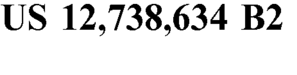

FIG. 6 illustrates, in a simplified cross-sectional view, the example package-on-package semiconductor device 500 at a subsequent stage of manufacture in accordance with an embodiment. At this stage, the antenna sub-assembly 100 and the semiconductor die 502 mounted on the package substrate 400 are encapsulated with an encapsulant 602 (e.g., epoxy molding compound). In this embodiment, the semiconductor die 502, portions of the antenna sub-assembly 100, and portions of the top major side of the package substrate 400 are over-molded with the encapsulant 602 by way of a molding process such as a film-assisted molding (FAM) process. For example, a FAM tool using a conformal film may be engaged with a predetermined portion (e.g., antenna structure 116) of the top side of the antenna sub-assembly 100 during the molding process to keep the antenna structure 116 free of encapsulant 602. In this manner, the antenna structure 116 may be exposed at the top of the encapsulant 602. Alternatively, the semiconductor die 502, portions of the antenna sub-assembly 100, and portions of the top major side of the package substrate 400 may be encapsulated with the encapsulant 602 during an injection molding operation, for example, having the antenna structure 116 subsequently exposed at the top of the encapsulant 602 by way of laser ablation or selective etching.

Figure 7:
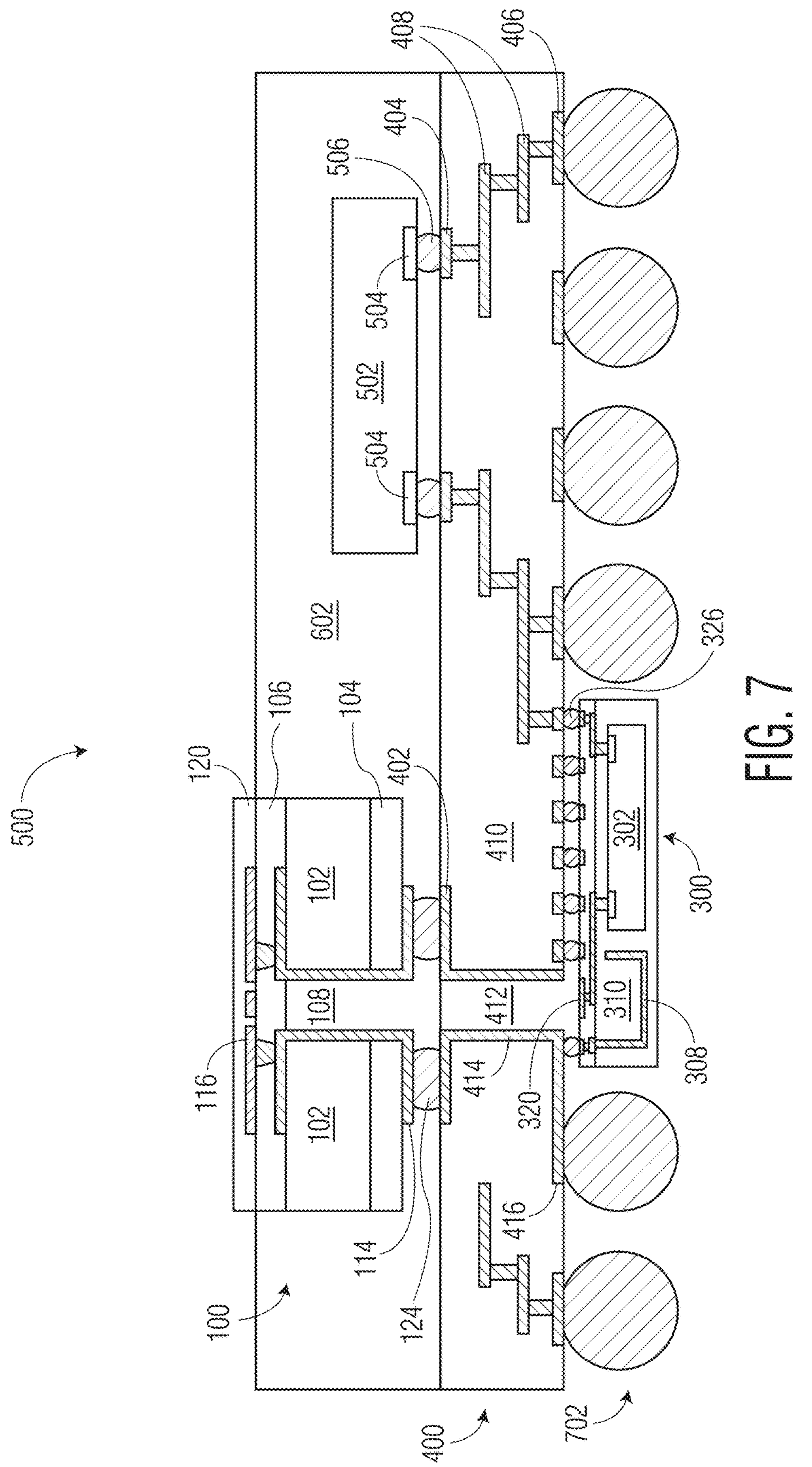

FIG. 7 illustrates, in a simplified cross-sectional view, the example package-on-package semiconductor device 500 at a subsequent stage of manufacture in accordance with an embodiment. At this stage, the package-on-package semiconductor device 500 includes the packaged RF semiconductor device 300 mounted on the bottom major side of the package substrate 400. In this embodiment, the packaged RF semiconductor device 300 is conductively connected to the first portion 422 (of FIG. 4) of the bottom side conductive pads 406 of the package substrate 400 by way of the low-profile conductive connectors 326. With the RF semiconductor device 300 attached to the package substrate 400, the signal launcher 320 formed in the RDL of the packaged RF semiconductor device 300 is substantially aligned with waveguide 412 of the package substrate 400 and waveguide 108 of the antenna sub-assembly 100. Accordingly, a substantially direct low-loss RF signal path from the semiconductor die 302 to the signal launcher 320 of the packaged RF semiconductor device 300 persists through the waveguides 412 and 108 and antenna structure 116 at the top side of the semiconductor device 500. In this embodiment, the metal signal reflector 308 of the packaged RF semiconductor device 300 may be conductively connected to a ground voltage supply by way of the package substrate 400 and respective one or more low-profile conductive connectors 326.

In this embodiment, a plurality of conductive package connectors 702 (e.g., solder balls) are affixed to the second portion 424 (of FIG. 4) of the bottom side conductive pads 406 of the package substrate 400. The conductive package connectors 702 are configured and arranged to provide conductive connections between the package substrate 400 and a PCB, for example. Accordingly, the semiconductor die 502 may be interconnected with the packaged RF semiconductor device 300 as well as the PCB by way of the conductive features of the package substrate 400. The conductive package connectors 702 may be in the form of suitable conductive structures such as solder balls, gold studs, copper pillars, and the like, to connect conductive features of the example package-on-package semiconductor device 500 with the PCB.

Figure 8:
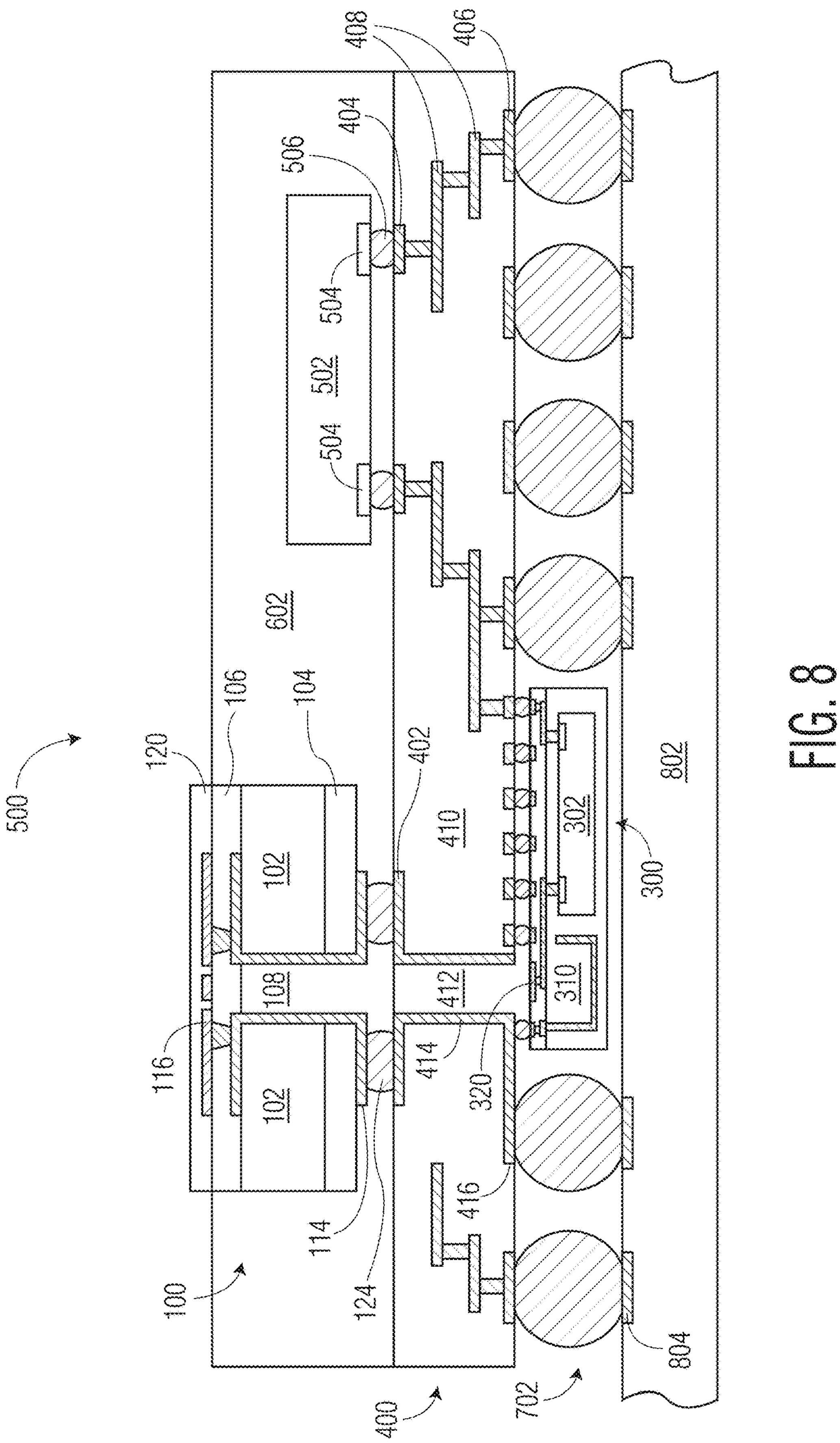

FIG. 8 illustrates, in a simplified cross-sectional view, the example package-on-package semiconductor device 500 at a subsequent stage of manufacture in accordance with an embodiment. At this stage, the package-on-package semiconductor device 500 with attached packaged RF semiconductor device 300 is mounted on an example PCB 802. In this embodiment, the package substrate 400 of the package-on-package semiconductor device 500 is interconnected with the PCB 802 by way of the plurality of conductive package connectors 702. For example, the second portion 424 (of FIG. 4) of the bottom side conductive pads 406 of the package substrate 400 is conductively connected to respective connection pads 804 exposed at a top side of the PCB 802 by way of the conductive package connectors 702. In this manner, semiconductor die 302 of the packaged RF semiconductor device 300 and semiconductor die 502 may be interconnected with conductive features of the PCB 802.

Generally, there is provided, a method including mounting an antenna sub-assembly on a first major side of a package substrate, the antenna sub-assembly comprising: an antenna substrate; an antenna substrate waveguide formed through a core portion of the antenna substrate, the antenna substrate waveguide aligned with a waveguide formed through the package substrate; and an antenna structure aligned with the antenna substrate waveguide; encapsulating with a first encapsulant at least a portion of the antenna sub-assembly and a portion of the first major side of the package substrate; and mounting a packaged radio frequency (RF) semiconductor device on a second major side of the package substrate, the packaged RF semiconductor device comprising: a first semiconductor die, a second encapsulant encapsulating the first semiconductor die, and a redistribution layer (RDL) formed over an active side of the first semiconductor die, a signal launcher formed from a conductive layer of the RDL and configured for propagation of an RF signal through the waveguide formed through the package substrate. The antenna substrate waveguide formed through the core portion of the antenna substrate may be formed as an air-filled antenna substrate waveguide. Sidewall surfaces of the antenna substrate waveguide may be plated with a metal material to form a metal lining of the antenna substrate waveguide. A continuous waveguide path may be formed between the signal launcher and the antenna structure by way of mounting the packaged RF semiconductor device and antenna sub-assembly on the package substrate. A die pad at the active side of the first semiconductor die may be interconnected to the signal launcher by way of the RDL. The antenna sub-assembly may be mounted on the first major side of the package substrate by way of a solder material. The solder material may form a continuous path around a perimeter of the antenna substrate waveguide and a perimeter of the waveguide at the first major side of the package substrate. The method may further include mounting a second semiconductor die on the first major side of the package substrate before encapsulating with the first encapsulant. The second semiconductor die may be interconnected with the packaged RF semiconductor device by way of the package substrate.

In another embodiment, there is provided, a semiconductor device including a package substrate including a waveguide formed through the package substrate; an antenna sub-assembly mounted on a first major side of the package substrate, the antenna sub-assembly comprising: an antenna substrate; an antenna substrate waveguide formed through a core portion of the antenna substrate, the antenna substrate waveguide aligned with the waveguide formed through the package substrate; and an antenna structure aligned with the antenna substrate waveguide; and a packaged radio frequency (RF) semiconductor device mounted on a second major side of the package substrate, the packaged RF semiconductor device comprising: a first semiconductor die, a first encapsulant encapsulating the first semiconductor die, and a redistribution layer (RDL) formed over an active side of the first semiconductor die, a signal launcher formed from a conductive layer of the RDL and configured for propagation of an RF signal through the waveguide formed through the package substrate. The antenna sub-assembly may be mounted on the first major side of the package substrate by way of a solder material, the solder material forming a continuous path around a perimeter of the antenna substrate waveguide at an interface formed between the antenna sub-assembly and the first major side of the package substrate. The semiconductor device may further include a second semiconductor die mounted on the first major side of the package substrate. The semiconductor device may further include a second encapsulant encapsulating at least a portion of the antenna sub-assembly at the first major side of the package substrate. The antenna structure of the antenna sub-assembly may be configured as a slot antenna. The packaged RF semiconductor device may further include a conductive lined cavity formed in the encapsulant, the conductive lined cavity configured as a signal reflector of the signal launcher.

In yet another embodiment, there is provided, a method including mounting an antenna sub-assembly on a first major side of a package substrate, the antenna sub-assembly comprising: an antenna substrate; an antenna substrate waveguide formed through a core portion of the antenna substrate, the antenna substrate waveguide aligned with a waveguide formed through the package substrate; and an antenna structure aligned with the antenna substrate waveguide; and mounting a packaged radio frequency (RF) semiconductor device on a second major side of the package substrate, the packaged RF semiconductor device comprising: a first semiconductor die, a first encapsulant encapsulating the first semiconductor die, and a redistribution layer (RDL) formed over an active side of the first semiconductor die, a signal launcher formed from a conductive layer of the RDL and configured for propagation of an RF signal through the waveguide formed through the package substrate. The method may further include mounting a second semiconductor die on the first major side of the package substrate. The method may further include encapsulating with a second encapsulant at least a portion of the antenna sub-assembly and the second semiconductor die. The antenna substrate waveguide formed through the core portion of the antenna substrate may be formed as an air-filled antenna substrate waveguide having a metal lining on sidewalls of the antenna substrate waveguide. A continuous waveguide path may be formed between the signal launcher and the antenna structure after mounting the packaged RF semiconductor device and antenna sub-assembly on the package substrate.

By now, it should be appreciated that there has been provided, a package-on-package semiconductor device including an integrated antenna. The package-on-package semiconductor device includes an antenna sub-assembly and a semiconductor die mounted on a top side of a package substrate. The antenna sub-assembly includes a non-conductive antenna substrate, an antenna substrate waveguide, and an antenna structure. The waveguide of the antenna sub-assembly is aligned with a waveguide formed through the package substrate. A packaged RF semiconductor device is mounted on a bottom side of the package substrate. The packaged RF semiconductor device includes a redistribution layer having a conductive layer configured to form a signal launcher. The signal launcher is interconnected with a semiconductor die of the RF semiconductor device by way of the redistribution layer. The signal launcher of the packaged RF semiconductor device is aligned with the waveguides of the package substrate and antenna sub-assembly. Accordingly, a low loss RF signal path from the RF semiconductor die through the waveguide of the package substrate and through the waveguide and antenna of antenna sub-assembly is formed. By forming the package-on-package semiconductor device with an embedded antenna sub-assembly in this manner, the RF signal radiation pattern is not obstructed by components of the semiconductor device.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:

mounting an antenna sub-assembly on a first major side of a package substrate, the antenna sub-assembly comprising:
- an antenna substrate;
- an antenna substrate waveguide formed through a core portion of the antenna substrate, the antenna substrate waveguide aligned with a waveguide formed through the package substrate; and
- an antenna structure aligned with the antenna substrate waveguide;

encapsulating with a first encapsulant at least a portion of the antenna sub-assembly and a portion of the first major side of the package substrate; and mounting a packaged radio frequency (RF) semiconductor device on a second major side of the package substrate, the packaged RF semiconductor device comprising:
- a first semiconductor die,
- a second encapsulant encapsulating the first semiconductor die, and
- a redistribution layer (RDL) formed over an active side of the first semiconductor die, a signal launcher formed from a conductive layer of the RDL and configured for propagation of an RF signal through the waveguide formed through the package substrate.

2. The method of claim 1, wherein the antenna substrate waveguide formed through the core portion of the antenna substrate is formed as an air-filled antenna substrate waveguide.

3. The method of claim 1, wherein sidewall surfaces of the antenna substrate waveguide are plated with a metal material to form a metal lining of the antenna substrate waveguide.

4. The method of claim 1, wherein a continuous waveguide path is formed between the signal launcher and the antenna structure by way of mounting the packaged RF semiconductor device and antenna sub-assembly on the package substrate.

5. The method of claim 1, wherein a die pad at the active side of the first semiconductor die is interconnected to the signal launcher by way of the RDL.

6. The method of claim 1, wherein the antenna sub-assembly is mounted on the first major side of the package substrate by way of a solder material.

7. The method of claim 6, wherein the solder material forms a continuous path around a perimeter of the antenna substrate waveguide and a perimeter of the waveguide at the first major side of the package substrate.

8. The method of claim 1, further comprising mounting a second semiconductor die on the first major side of the package substrate before encapsulating with the first encapsulant.

9. The method of claim 8, wherein the second semiconductor die is interconnected with the packaged RF semiconductor device by way of the substrate package.

10. A semiconductor device comprising:

a package substrate including a waveguide formed through the package substrate;

an antenna sub-assembly mounted on a first major side of the package substrate, the antenna sub-assembly comprising:

an antenna substrate;

an antenna substrate waveguide formed through a core portion of the antenna substrate, the antenna substrate waveguide aligned with the waveguide formed through the package substrate; and an antenna structure aligned with the antenna substrate waveguide; and a packaged radio frequency (RF) semiconductor device mounted on a second major side of the package substrate, the packaged RF semiconductor device comprising:

a first semiconductor die, a first encapsulant encapsulating the first semiconductor die, and a redistribution layer (RDL) formed over an active side of the first semiconductor die, a signal launcher formed from a conductive layer of the RDL and configured for propagation of an RF signal through the waveguide formed through the package substrate.

11. The semiconductor device of claim 10, wherein the antenna sub-assembly is mounted on the first major side of the package substrate by way of a solder material, the solder material forming a continuous path around a perimeter of the antenna substrate waveguide at an interface formed between the antenna sub-assembly and the first major side of the package substrate.

12. The semiconductor device of claim 10, further comprising a second semiconductor die mounted on the first major side of the package substrate.

13. The semiconductor device of claim 10, further comprising a second encapsulant encapsulating at least a portion of the antenna sub-assembly at the first major side of the package substrate.

14. The semiconductor device of claim 10, wherein the antenna structure of the antenna sub-assembly is configured as a slot antenna.

15. The semiconductor device of claim 10, wherein the packaged RF semiconductor device further comprises a conductive lined cavity formed in the encapsulant, the conductive lined cavity configured as a signal reflector of the signal launcher.

16. A method comprising:

mounting an antenna sub-assembly on a first major side of a package substrate, the antenna sub-assembly comprising:

an antenna substrate;

an antenna substrate waveguide formed through a core portion of the antenna substrate, the antenna substrate waveguide aligned with a waveguide formed through the package substrate; and an antenna structure aligned with the antenna substrate waveguide; and mounting a packaged radio frequency (RF) semiconductor device on a second major side of the package substrate, the packaged RF semiconductor device comprising:

a first semiconductor die, a first encapsulant encapsulating the first semiconductor die, and a redistribution layer (RDL) formed over an active side of the first semiconductor die, a signal launcher formed from a conductive layer of the RDL and configured for propagation of an RF signal through the waveguide formed through the package substrate.

17. The method of claim 16, further comprising mounting a second semiconductor die on the first major side of the package substrate.

18. The method of claim 17, further comprising encapsulating with a second encapsulant at least a portion of the antenna sub-assembly and the second semiconductor die.

19. The method of claim 16, wherein the antenna substrate waveguide formed through the core portion of the antenna substrate is formed as an air-filled antenna substrate waveguide having a metal lining on sidewalls of the antenna substrate waveguide.

20. The method of claim 16, wherein a continuous waveguide path is formed between the signal launcher and the antenna structure after mounting the packaged RF semiconductor device and antenna sub-assembly on the package substrate.

* * * * *